United States Patent
Yeong et al.

(10) Patent No.: US 10,062,688 B2
(45) Date of Patent: Aug. 28, 2018

(54) SEMICONDUCTOR DEVICE WITH EPITAXIAL SOURCE/DRAIN

(71) Applicant: TAIWAN SEMICONDUCTOR MANUFACTURING CO., LTD., Hsinchu (TW)

(72) Inventors: Sai-Hooi Yeong, Zhubei (TW); Sheng-Chen Wang, Hsinchu (TW); Tsung-Yao Wen, Hsinchu (TW); Yen-Ming Chen, Chu-Pei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 14/987,509

(22) Filed: Jan. 4, 2016

(65) Prior Publication Data
US 2017/0194321 A1     Jul. 6, 2017

(51) Int. Cl.
*H01L 27/088* (2006.01)
*H01L 21/8234* (2006.01)
*H01L 29/417* (2006.01)
*H01L 21/265* (2006.01)
*H01L 21/223* (2006.01)

(52) U.S. Cl.
CPC ...... *H01L 27/0886* (2013.01); *H01L 21/2236* (2013.01); *H01L 21/26513* (2013.01); *H01L 21/823412* (2013.01); *H01L 21/823425* (2013.01); *H01L 21/823431* (2013.01); *H01L 29/41775* (2013.01)

(58) Field of Classification Search
CPC ......... H01L 21/2633; H01L 21/823431; H01L 21/265–21/266; H01L 29/785; H01L 29/41775; H01L 296/785; H01L 27/0886; H01L 27/092; H01L 27/0922; H01L 21/823821; H01L 21/823418; H01L 2924/13067
See application file for complete search history.

(56) References Cited

U.S. PATENT DOCUMENTS

| | | |
|---|---|---|
| 8,487,378 B2 | 7/2013 | Goto et al. |
| 8,729,634 B2 | 5/2014 | Shen et al. |
| 8,826,213 B1 | 9/2014 | Ho et al. |
| 8,887,106 B2 | 11/2014 | Ho et al. |
| 2013/0228862 A1* | 9/2013 | Lee ................ H01L 21/823807 257/347 |
| 2014/0282326 A1 | 9/2014 | Chen et al. |
| 2015/0303283 A1* | 10/2015 | Chien ................ H01L 29/7848 438/478 |

\* cited by examiner

*Primary Examiner* — Jose R Diaz
(74) *Attorney, Agent, or Firm* — Haynes and Boone, LLP (57) ABSTRACT

A semiconductor device and a method of manufacturing the semiconductor device are provided. The semiconductor device includes a fin extending along a first direction over a substrate and a gate structure extending in a second direction overlying the fin. The gate structure includes a gate dielectric layer overlying the fin, a gate electrode overlying the gate dielectric layer, and a first insulating gate sidewall on a first lateral surface of the gate electrode extending along the second direction. A source/drain region is formed in the fin in a region adjacent the gate structure. A portion of the source/drain region extends under the insulating gate sidewall for a substantially constant distance along the first direction.

19 Claims, 12 Drawing Sheets

SEMICONDUCTOR DEVICE WITH EPITAXIAL SOURCE/DRAIN

BACKGROUND

As the semiconductor industry has progressed into nanometer technology process nodes in pursuit of higher device density, higher performance, and lower costs, challenges from both fabrication and design issues have resulted in the development of three-dimensional designs, such as a fin field effect transistor (FinFET). FinFET devices typically include semiconductor fins with high aspect ratios and in which channel and source/drain regions of semiconductor transistor devices are formed. A gate is formed over and along the sides of the fin structure (e.g., wrapping) utilizing the advantage of the increased surface area of the channel and source/drain regions to produce faster, more reliable and better-controlled semiconductor transistor devices. In some devices, strained materials in source/drain (S/D) portions of the FinFET utilizing, for example, silicon germanium (SiGe), silicon phosphide (SiP) or silicon carbide (SiC), may be used to enhance carrier mobility.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. In addition, the term "made of" may mean either "comprising" or "consisting of."

Various embodiments of the disclosure relate to semiconductor devices and methods for forming the same. In various embodiments, the semiconductor device includes FinFET transistors. FinFET transistors are field effect transistors formed on fin structures formed over a substrate. In some embodiments, the fins are formed in an array.

Figure 1:
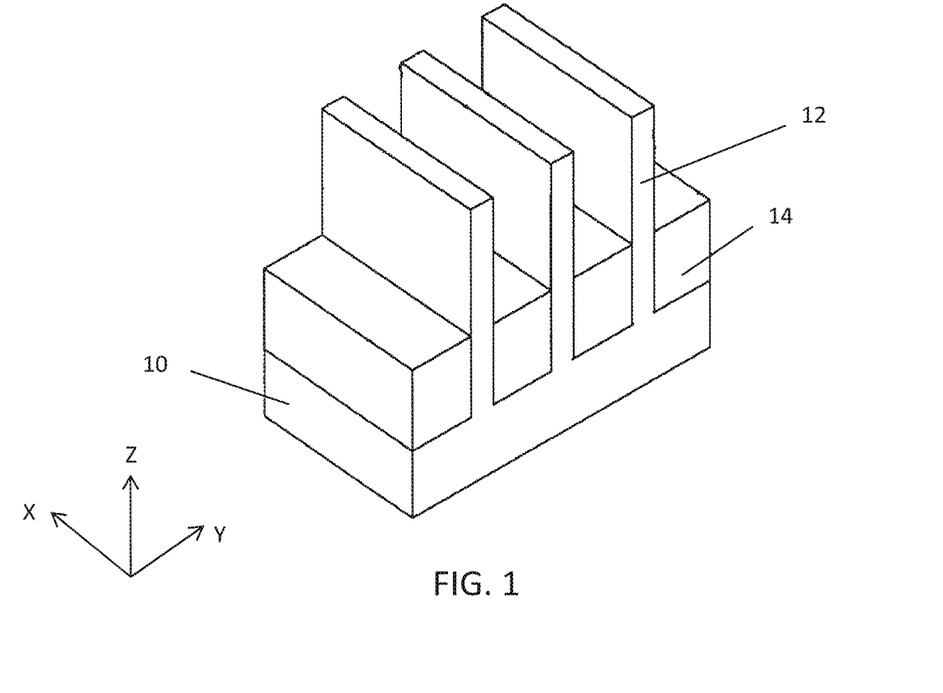
FIGS. 1-5 show an exemplary process for manufacturing a semiconductor device according to one embodiment of the present disclosure.

According to an embodiment of the disclosure, a method for manufacturing a semiconductor device includes forming a fin structure comprising one or more fins 12 over a semiconductor substrate 10, as shown in FIG. 1. In one embodiment, the semiconductor substrate 10 is a silicon substrate. Alternatively, the semiconductor substrate 10 may include germanium, silicon germanium, gallium arsenide or other appropriate semiconductor materials. Also alternatively, the semiconductor substrate may include an epitaxial layer. For example, the semiconductor substrate may have an epitaxial layer overlying a bulk semiconductor. Further, the semiconductor substrate may be strained for performance enhancement. For example, the epitaxial layer may include a semiconductor material different from that of the bulk semiconductor, such as a layer of silicon germanium overlying bulk silicon or a layer of silicon overlying bulk silicon germanium. Such strained substrates may be formed by selective epitaxial growth (SEG). Furthermore, the semiconductor substrate may include a semiconductor-on-insulator (SOI) structure. Also alternatively, the semiconductor substrate may include a buried dielectric layer, such as a buried oxide (BOX) layer, such as that formed by separation by implantation of oxygen (SIMOX) technology, wafer bonding, SEG, or other appropriate method. In other embodiments, the substrate may comprise a compound semiconductor including IV-IV compound semiconductors such as SiC and SiGe, III-V compound semiconductors such as GaAs, GaP, GaN, InP, InAs, InSb, GaAsP, AlGaN, AlInAs, AlGaAs, GaInAs, GaInP, and/or GaInAsP; or combinations thereof. In certain embodiments, the semiconductor substrate 10 is, for example, a p-type silicon substrate with an impurity concentration in a range of about $1 \times 10^{15}$ $cm^{-3}$ to about $2 \times 10^{15}$ $cm^{-3}$. In other embodiments, the semiconductor substrate 10 is an n-type silicon substrate with an impurity concentration in a range of about $1 \times 10^{15}$ $cm^{-3}$ to about $2 \times 10^{15}$ $cm^{-3}$.

Fins 12 are disposed over the semiconductor substrate 10 and the fins 12 may be made of the same material as the semiconductor substrate 10 and may continuously extend from the semiconductor substrate 10. The fins 12 may be formed by selectively etching the semiconductor substrate 10. Alternatively, the fins 12 may be formed using an EPI first method. In the EPI first methods, an epitaxial layer is formed on the semiconductor substrate 10, and then the epitaxial layer is subsequently patterned to form fins 12.

A photolithography process can be used to define fins 12 on the semiconductor substrate 10. In some embodiments, a hard mask layer is formed on the semiconductor substrate 10. The hard mask layer may comprise a bilayer of SiN and $SiO_2$. A photoresist layer is spin-on coated on semiconductor substrate. The photoresist is patterned by selective exposure of the photoresist to actinic radiation. Generally, patterning may include photoresist coating (e.g., spin-on coating), soft baking, mask aligning, exposing, post-exposure baking, developing the photoresist, rinsing, drying (e.g., hard baking), other suitable processes, or combinations thereof. Alternatively, the photolithography exposing process is implemented or replaced by other proper methods such as maskless photolithography, electron-beam writing, direct-writing, ion-beam writing, and/or nano-imprinting.

The pattern of the photoresist layer is subsequently transferred into the hard mask layer by etching the exposed area of the hard mask layer. The hard mask layer is subsequently used as a mask during etching of the semiconductor substrate. The semiconductor substrate may be etched by various methods, including a dry etch, a wet etch, or a combination of dry etch and wet etch. The dry etching process may implement fluorine-containing gas (e.g., $CF_4$, $SF_6$, $CH_2F_2$, $CHF_3$, and/or $C_4F_8$), chlorine-containing gas (e.g., $Cl_2$, $CHCl_3$, $CCl_4$, and/or $BCl_3$), bromine-containing gas (e.g., HBr and/or $CHBr_3$), oxygen-containing gas, iodine-containing gas, other suitable gases and/or plasmas, or combinations thereof. The etching process may include a multiple-step etching to gain etch selectivity, flexibility and desired etch profile.

In certain embodiments, the semiconductor device includes an insulating material formed over the semiconductor substrate 10 along lower portions of the fin 12. The insulating material forms shallow trench isolation (STI) regions 14 between a plurality of fins in embodiments comprising a plurality of fins. The STI regions 14 may comprise silicon oxide, silicon nitride, silicon oxynitride, other suitable materials, and combinations thereof. STI regions 14 may be formed by any suitable process. As one embodiment, the STI regions 14 are formed by filling the region between fins with one or more dielectric materials by using chemical vapor deposition (CVD). In some embodiments, the filled region may have a multi-layer structure such as a thermal oxide liner layer filled with silicon nitride or silicon oxide. An annealing process may be performed after the formation of the STI region. The annealing process includes rapid thermal annealing (RTA), laser annealing processes, or other suitable annealing processes.

In some embodiments, the STI regions 14 are formed using flowable CVD. In flowable CVD, flowable dielectric materials instead of silicon oxide are deposited. Flowable dielectric materials, as their name suggest, can "flow" during deposition to fill gaps or spaces with a high aspect ratio. Usually, various chemistries are added to silicon-containing precursors to allow the deposited film to flow. In some embodiments, nitrogen hydride bonds are added. Examples of flowable dielectric precursors, particularly flowable silicon oxide precursors, include a silicate, a siloxane, a methyl silsesquioxane (MSQ), a hydrogen silsesquioxane (HSQ), an MSQ/HSQ, a perhydrosilazane (TCPS), a perhydro-polysilazane (PSZ), a tetraethyl orthosilicate (TEOS), or a silyl-amine, such as trisilylamine (TSA). These flowable silicon oxide materials are formed in a multiple-operation process. After the flowable film is deposited, it is cured and then annealed to remove un-desired element(s) to form silicon oxide. When the un-desired element(s) is removed, the flowable film densifies and shrinks. In some embodiments, multiple anneal processes are conducted. The flowable film is cured and annealed more than once at temperatures, such as in a range from about 600° C. to about 1200° C., and for an extended period, such as on hour or more in total.

A chemical mechanical polishing (CMP) operation is performed to remove excess material from the STI region and to provide a substantially planar surface. Dopant is subsequently implanted into the fins to form n and p wells and then the device is subsequently annealed. The STI region is etched back to remove a portion of the STI region and expose the upper portions of the fins where the gate structure, and source/drain regions are subsequently formed. The formation of the gate structure may include additional depositing, patterning, and etching processes. The STI removal is performed by a suitable etching process, such as a semi-isotropic etch using $HF+NH_3$ with plasma or $NF_3+NH_3$ with plasma; or an isotropic etch, such as dilute HF.

Figure 2:
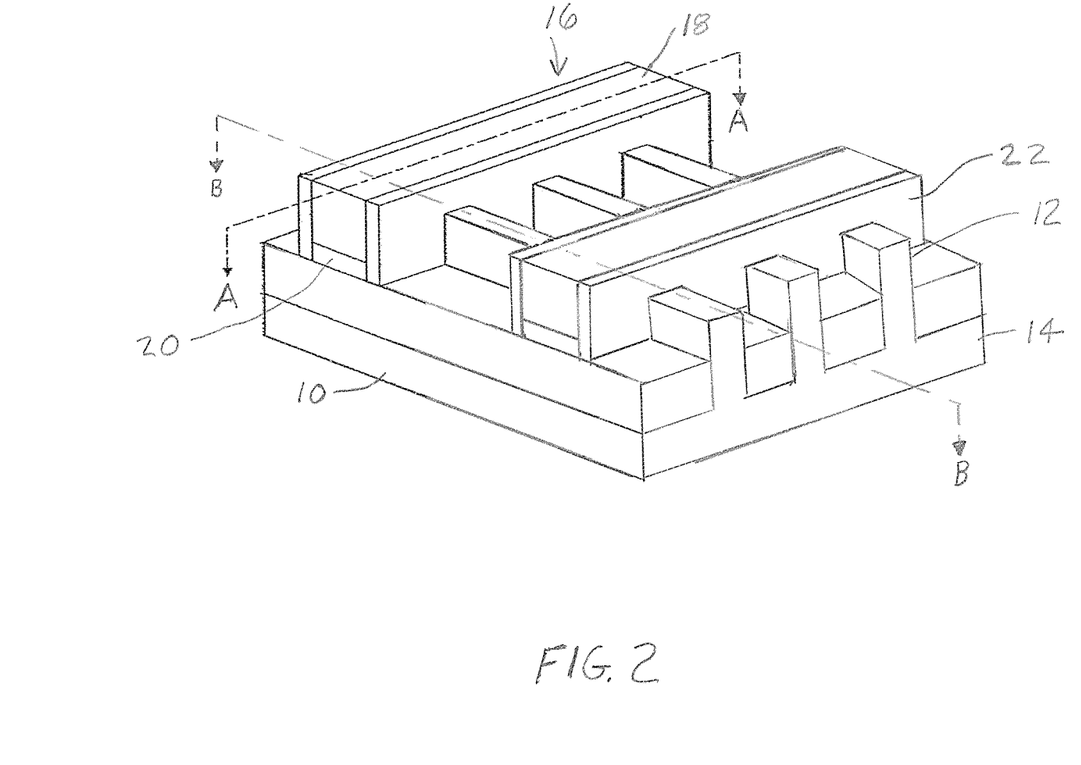
Figure 3:
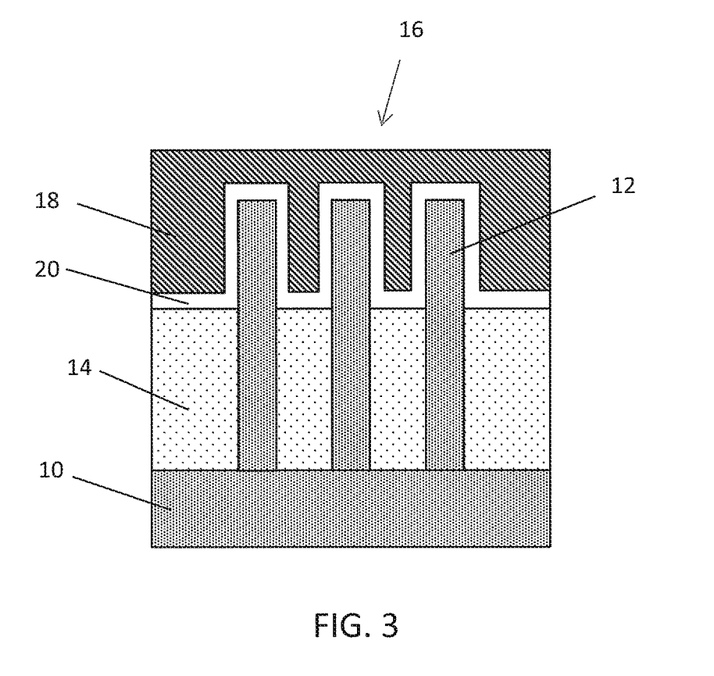
Figure 4:
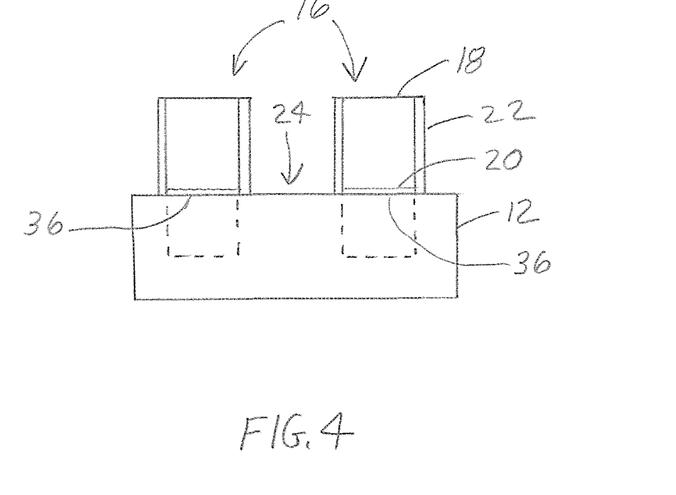

In certain embodiments, one or more gate structures 16 are formed over the fin structures, as shown in FIG. 2. The gate structure formation process may include the operations of depositing a gate dielectric 20, depositing a gate electrode material, and patterning the deposited gate material into gate electrodes 18. Sidewall spacers 22 are subsequently formed on the gate electrodes 18. FIG. 3 is a cross section taken along line A-A of FIG. 2, showing the arrangement of the fins 12 and the gate structure 16. FIG. 4 is a cross section taken along line B-B of FIG. 2, showing the arrangement of gate structures 16 overlying second regions 36 of the fin 12. Dashed lines on the fins 12 in FIG. 4 and subsequent drawings show the projection of the gate electrode wrapping around the fin. In subsequent drawings the gate dielectric layer is not shown underlying the gate electrodes to simplify the drawings.

The gate dielectric 20 may comprise silicon oxide, silicon nitride, silicon oxynitride, high-k dielectric material, other suitable dielectric material, and/or combinations thereof. The gate electrode 18 in certain embodiments is formed of polysilicon and may include a hard mask formed over the gate electrode. The hard mask may be made a suitable hard mask material, including $SiO_2$, SiN, or SiCN. The gate structure may comprise additional layers such as interfacial layers, capping layers, diffusion/barrier layers, dielectric layers, conductive layers, and other suitable layers, and combinations thereof. Instead of polysilicon, the gate electrode 18 may comprise any other suitable material, such as aluminum, copper, titanium, tantalum, tungsten, molybdenum, tantalum nitride, nickel silicide, cobalt silicide, TiN, WN, TiAl, TiAlN, TaCN, TaC, TaSiN, metal alloys, other suitable materials, or combinations thereof.

In certain embodiments, the FinFET can be fabricated using a gate first method or a gate last method. In embodiments using a high-k dielectric and a metal gate (HK/MG), a gate last method is employed to form the gate electrode. In the gate last method, a dummy gate is formed, the dummy gate is subsequently removed at a later operation after a high temperature annealing operation, and the high k dielectric and a metal gate (HK/MG) is formed.

According to embodiments of the disclosure, the high k gate dielectric 20 may comprise $HfO_2$, HfSiO, HfSiON, HfTaO, HfTiO, HfZrO, zirconium oxide, aluminum oxide, hafnium dioxide-alumina ($HfO_2$—$Al_2O_3$) alloy, other suitable high-k dielectric materials, or combinations thereof. The metal gate material may comprise one or more layers of Ti, TiN, titanium-aluminum alloy, Al, AlN, Ta, TaN, TaC, TaCN, TaSi, and the like.

In some embodiments, the sidewall spacers 22 are used to offset subsequently formed doped regions, such as source/drain regions. The sidewall spacers 22 may further be used for designing or modifying the source/drain region (junction) profile. The sidewall spacers 22 may be formed by suitable deposition and etch techniques, and may comprise silicon nitride, silicon carbide, silicon oxynitride, other suitable materials, or combinations thereof. In certain embodiments, the sidewall spacers include a plurality of layers. The plurality of layers may include an oxide layer with an overlying nitride or carbide layer.

Figure 5:
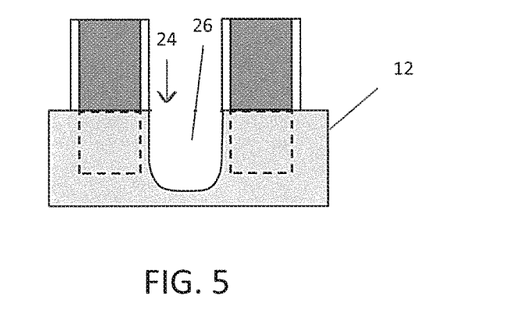

Adverting to FIG. 5, the fin 12 is anisotropically etched at a first region 24 to form a recess 26. The etching operation is carried out using suitable conventional anisotropic etching techniques.

Figure 6:
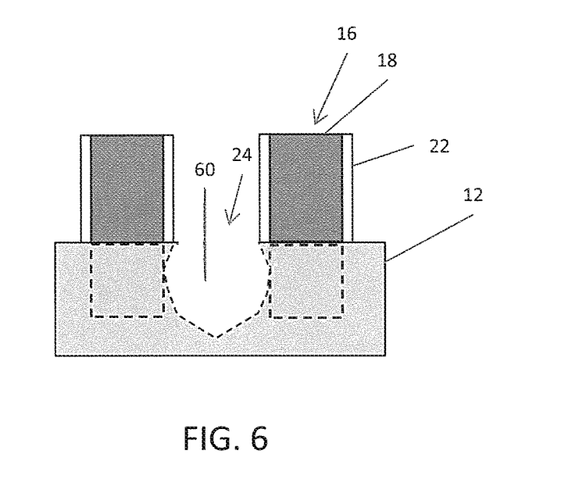
FIGS. 6 and 7 show another process for manufacturing a semiconductor device.

To improve performance of the FinFET it is desirable to locate source/drain regions adjacent the channel region underlying the gate electrode. To form the source/drain regions in close proximity to the gate electrode, the recess is further etched to undercut the sidewall spacers. In embodiments of the disclosure, etching of the recess is continued to undercut the gate electrode. As shown in FIG. 6, isotropic etching is performed to undercut at least a portion of the sidewall spacers 22. In certain embodiments, the etching operation is continued to further etch a portion of the fin 12 underlying the gate electrode 18. The isotropic etching operation is carried out using suitable conventional isotropic etchants selective to the fin material and suitable etching techniques. Isotropic etching, however, produces an enlarged recess 60 with a non-uniform boundary, as shown in FIG. 6.

Figure 7:
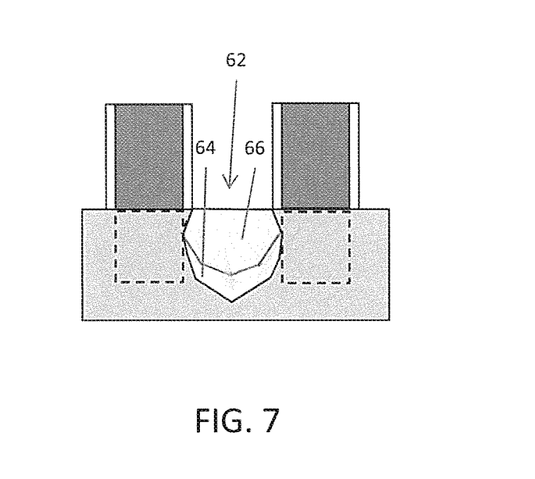

Source or drain regions 62 comprising a lightly doped region 64 and a highly doped region 66 are subsequently formed in the enlarged recess 60, as shown in FIG. 7. The source or drain regions 62 may be formed by a suitable epitaxy technique. For example, the lightly doped region 64 may be formed by epitaxial deposition of a semiconductor material, such as Si or SiGe for PMOS region, and Si, SiC, or SiCP for an NMOS region. The highly doped region 66 may be formed by epitaxial deposition of a semiconductor material, such as SiGe or Ge for a PMOS region, and SiP or SiCP for an NMOS region. The semiconductor materials may be doped with an appropriate amount of known dopants in accordance with the desired function of the semiconductor device.

In order to have improved control over the semiconductor fabrication process and control over the semiconductor operating parameters, it is desirable to form the source and drain regions with a substantially uniform spacing from the gate electrode. Substantially uniform spacing of the source and drain regions can be achieved by forming a uniformly doped region in the recess and then etching the doped region.

Figure 8:
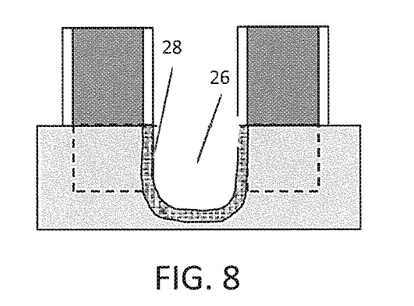
FIGS. 8-10 show further operations of an exemplary process for manufacturing a semiconductor device according to an embodiment of the present disclosure.

As shown in FIG. 8, a uniformly doped region 28 is formed in a surface of the recess 26. The doped region 28 can be formed by implanting a dopant to a substantially uniform depth in the fin 12. The substantially uniform depth of implanting a dopant can be achieved by conformally doping the surface of the recess 26. The doped region 28 may be a layer on the fin 12 in the surface of recess 26 having a thickness of about 0.5 nm to about 10 nm. In certain embodiments of the present disclosure the doped region 28 is formed by plasma doping.

Plasma doping is performed in a plasma doping apparatus equipped with an inductively coupled plasma (ICP) source in a certain embodiments. The temperature of the semiconductor wafer can be maintained below 40° C. during the doping operation in certain embodiments. The dopant material gas can be suitable dopant gas, including $AsH_3$ or $B_2H_6$ in combination with an inert carrier gas, such as He or Ar. The dopant gas mass concentration ranges from about 0.01 to about 5 mass % based on the total gas concentration (dopant gas+carrier gas) in certain embodiments. The gas flowrate during the doping operation ranges from about 5 to about 2000 cm$^3$/min during the plasma doping operation in certain embodiments. The pressure in the plasma doping apparatus during the doping operation ranges from about 0.05 Pa to about 10 Pa in certain embodiments. The plasma can be generated at a power ranging form about 100 W to about 2500 W in certain embodiments.

Figure 9:
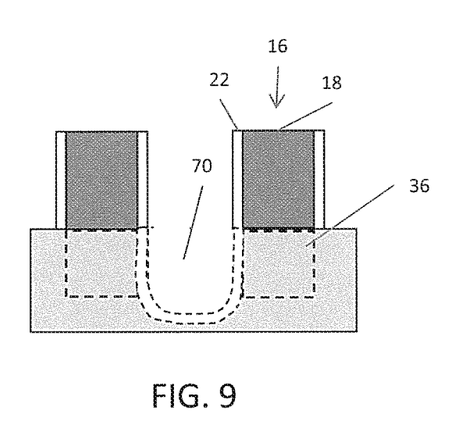

The conformally doped region 28 at the surface of fin 12 can be selectively etched relative to the undoped portion of the fin 12, thereby uniformly extending the recess 26 into the portion of the fin 12 underlying the gate structure 16 to form an enlarged recess 70, as shown in FIG. 9. The selective etching of the doped region 28 may be performed using an isotropic etching technique. A liquid etchant that is selective to the doped region 28 is used in certain embodiments. Suitable liquid etchants include a mixture of sulfuric acid ($H_2SO_4$) and hydrogen peroxide ($H_2O_2$) (also known as SPM or piranha etch).

Figure 10:
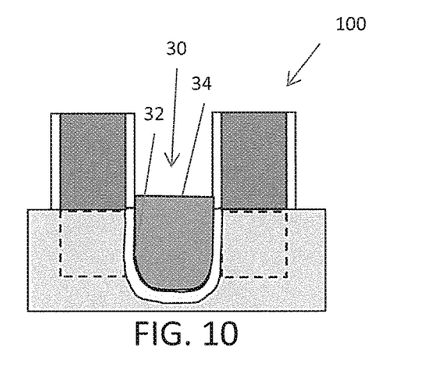

Source or drain regions 30 comprising a lightly doped region 32 and a highly doped region 34 are subsequently formed in the enlarged recess 70, to form a semiconductor device 100, as shown in FIG. 10. The source or drain regions 30 may be formed by one or more epitaxy or epitaxial (epi) processes, such that Si features, SiC features, SiGe features, SiP features, SiCP features, or other suitable features are formed in a crystalline state on the fins. The epitaxy processes include CVD deposition techniques (e.g., vapor-phase epitaxy (VPE) and/or ultra-high vacuum CVD (UHV-CVD)), atomic layer deposition (ALD), molecular beam epitaxy, and/or other suitable processes.

For example, the lightly doped region 32 may be formed by epitaxial deposition of a semiconductor material, such as Si or SiGe for a PMOS region, and Si, SiC, or SiCP for an NMOS region. The highly doped region 34 may be formed by epitaxial deposition of a semiconductor material, such as SiGe or Ge for a PMOS region, and SiP or SiCP for an NMOS region. The semiconductor materials may be doped with an appropriate amount of known dopants by ion implantation in accordance with the desired function of the semiconductor device.

The ion implantation may be an n-type dopant, such as arsenic or phosphorus, for an NMOS, or a p-type dopant, such as boron, for a PMOS. Implant energies and dosages for doping respectively range from about 10 to 60 keV and from about $1\times10^{13}$ to $5\times10^{14}$ dopants/cm$^2$ for doping the lightly doped region 32 in certain embodiments. Implant energies and dosages for doping respectively range from about 10 keV to 80 keV and from about $8\times10^{14}$ to $2\times10^{16}$ dopants/cm$^2$ for doping the highly doped region 34. The doping of the source/drain regions 30 amorphizes the semiconductor, which must then be recrystallized to activate the source/drain regions 30. After ion implantation of the dopant, the semiconductor devices are annealed, such as by rapid thermal/milli-second/laser anneal, to recrystallize the source and drain regions 30.

Figure 11:
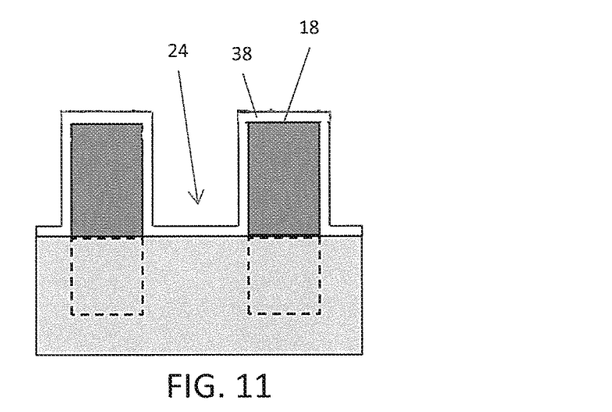
FIGS. 11-16 show an exemplary process for manufacturing a semiconductor device according to another exemplary embodiment of the present disclosure.

FIG. 11 illustrates another embodiment of forming a CMOS device. The CMOS device has a plurality of regions including an NMOS region and a PMOS region. The PMOS and NMOS regions are typically separated by an STI region. An insulating layer 38 is conformally formed over the gate electrode 18 and the first region 24 of the fin 12. The insulating layer is a nitride layer 38 in certain embodiments. The operations on only one region (NMOS or PMOS) is depicted, as the same operations through the removal of the doped region are performed on both the NMOS and PMOS regions.

Figure 12:
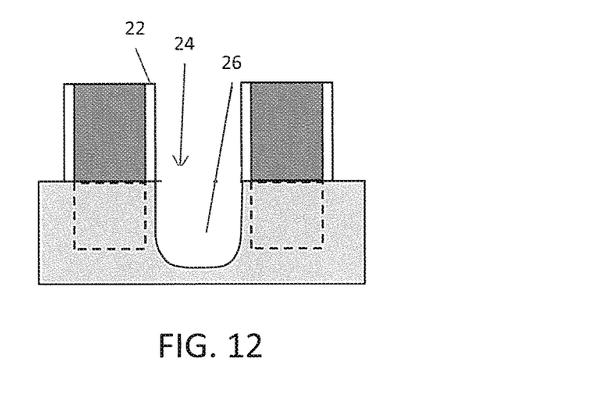

Adverting to FIG. 12, the insulating layer 38 is anisotropically etched exposing the first region 24 of the fin 12, and then the first region 24 of the fin 12 is anisotropically etched to form a recess 26. The etching operation is carried out using suitable conventional anisotropic etching techniques.

Figure 13:
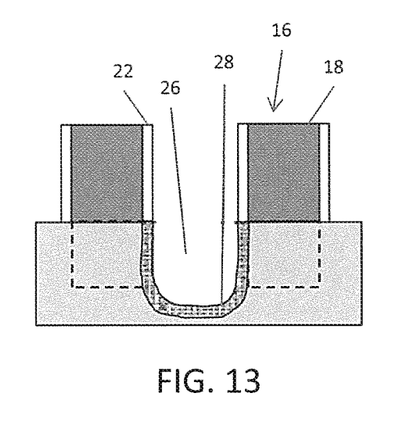
Figure 14:
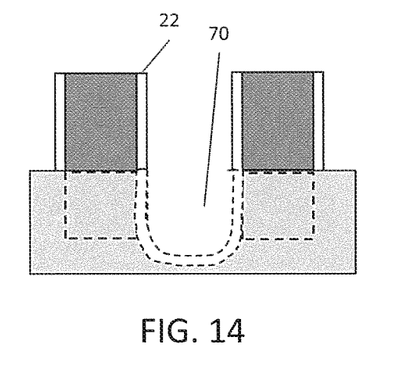

As shown in FIG. 13, a uniformly doped region 28 is formed in a surface of the recess 26. The doped region 28 can be formed by plasma doping, as explained herein, implanting a dopant to a substantially uniform depth in the fin 12. The substantially uniform depth of implanting a dopant can be achieved by conformally doping the surface of the recess 26. As shown in FIG. 14, the conformally doped surface of the portion of the fin 12 lining the recess 26 can be selectively etched relative to the undoped portion of the fin 12, thereby forming an enlarged recess 70 uniformly extending into the portion of the fin 12 underlying the gate structure 16, as explained herein.

Figure 15:
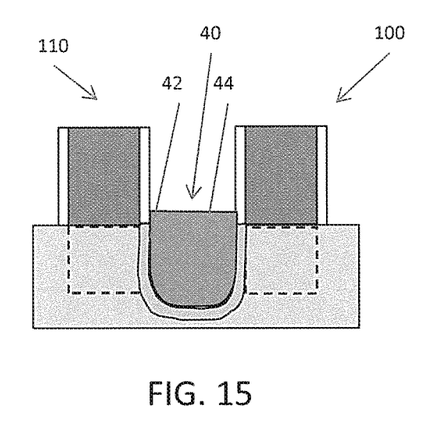

The NMOS and PMOS regions are formed independently of each other. For example, the NMOS region can be blocked (not shown) while semiconductor materials are epitaxially deposited into the enlarged recess 70 of the PMOS region 110, as shown in FIG. 15 to form source or drain regions 40 comprising a lightly doped region 42 and a highly doped region 44. The source or drain regions 40 may be formed by a suitable epitaxy technique followed by ion implantation of an appropriate amount of known dopants in accordance with the desired function of the semiconductor device. In certain embodiments, the semiconductor material deposited to form the lightly doped region 42 is Si or SiGe, and the semiconductor material deposited to form the highly doped region 44 is SiGe or Ge.

Figure 16:
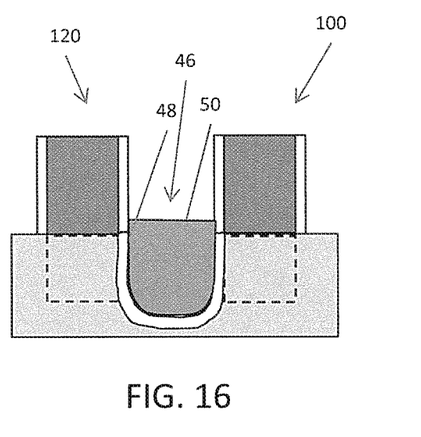

After forming the PMOS region 110, the blocking layer overlying the NMOS region 120 is removed in some embodiments and the PMOS region 110 is blocked (not shown) while semiconductor materials are epitaxially deposited into the enlarged recess 70 of the NMOS region 120, as shown in FIG. 16. The NMOS region 120 includes source or drain regions 46 comprising a lightly doped region 48 and a highly doped region 50. The source or drain regions 46 may be formed by a suitable epitaxy technique followed by ion implantation of an appropriate amount of known dopants in accordance with the desired function of the semiconductor device. In certain embodiments, the semiconductor material deposited to form the lightly doped region 42 is Si, SiC, or SiCP, and the semiconductor material deposited to form the highly doped region 44 is SiP or SiCP. The operations for forming the PMOS and NMOS regions are interchangeable. The source and drains can be formed first in the NMOS while blocking the PMOS region, and then source and drains are subsequently formed in the PMOS region while blocking the NMOS region.

The exemplary semiconductor devices 100 described thus far in the present disclosure are high voltage threshold (HVT) devices. In other embodiments of the present disclosure standard voltage threshold (SVT) 200 and low voltage threshold (LVT) 300 devices are formed.

Figure 17:
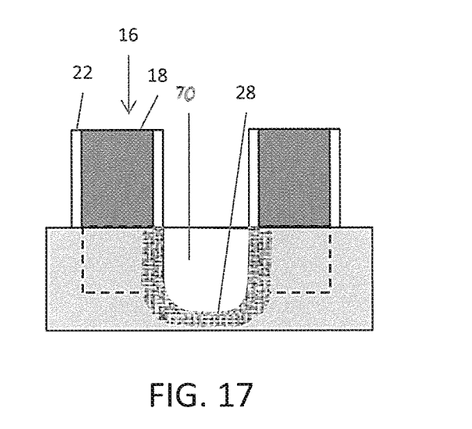
FIGS. 17 and 18 show a semiconductor device according to another exemplary embodiment according to the present disclosure.
Figure 18:
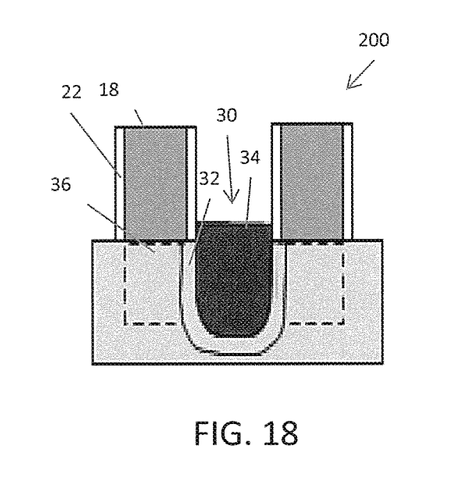

As shown in FIGS. 17 and 18, an SVT device 200 is formed in certain embodiments of the disclosure. In the SVT device the doped region 28 is formed to a greater thickness in the fin 12, than the doped region 28 in the HVT device 100. In certain embodiments, the doped region 28 of the SVT device 200 is about 0.5 nm to 2 nm thicker than the doped region 28 of the HVT device 100. In the SVT device 200 the doped region 28 and the subsequently formed source and drain regions 30 extend under the gate electrode 18 in the second region 36 of the fin.

Figure 19:
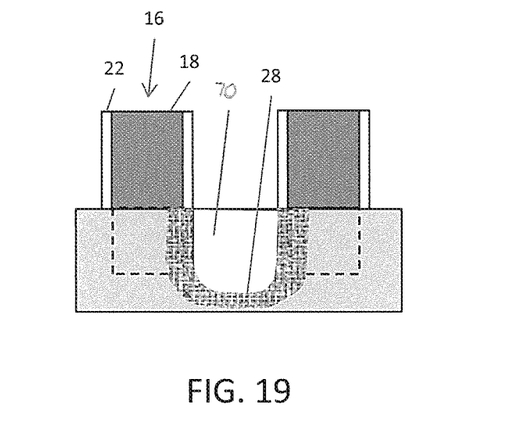
FIGS. 19 and 20 show a semiconductor device according to another exemplary embodiment according to the present disclosure.
Figure 20:
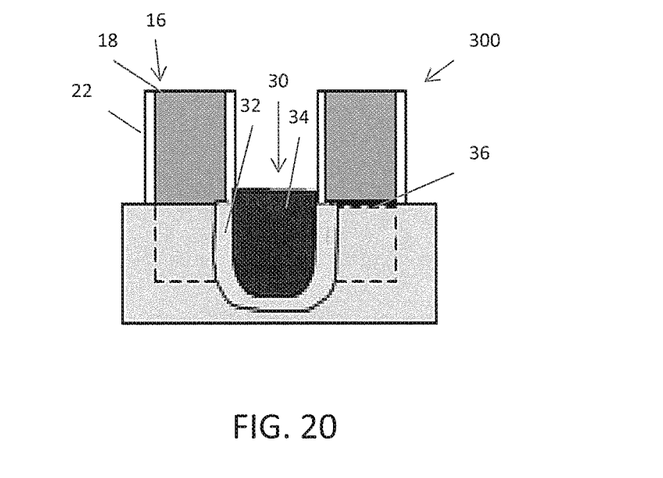

As shown in FIGS. 19 and 20, an LVT device 300 is formed in certain embodiments of the disclosure. In the LVT device the doped region 28 is formed to a greater thickness in the fin 12, than the doped region 28 in the SVT device 100. In certain embodiments, the doped region 28 of the LVT device 300 is about 0.5 nm to 2 nm thicker than the doped region 28 of the SVT device 100. In the LVT device 300 the doped region 28 and the subsequently formed source and drain regions 30 extend further under the gate electrode 18 in the second region 36 of the fin than when an SVT device is formed.

In some embodiments of the disclosure, source/drain electrodes are formed contacting the respective source/drain regions. The electrodes may be formed of a suitable conductive material, such as copper, tungsten, nickel, titanium, or the like. In some embodiments, a metal silicide is formed at the conductive material and source/drain interface to improve conductivity at the interface. In one example, a damascene and/or dual damascene process is used to form copper-based multilayer interconnection structures. In another embodiment, tungsten is used to form tungsten plugs.

Subsequent processing according to embodiments of the disclosure may also form various contacts/vias/lines and multilayer interconnects features (e.g., metal layers and interlayer dielectrics) on the semiconductor substrate, configured to connect the various features or structures of the FinFET device. For example, a multilayer interconnection includes vertical interconnects, such as conventional vias or contacts, and horizontal interconnects, such as metal lines.

In one embodiment of the present disclosure, a semiconductor device is provided. The semiconductor device includes a fin extending along a first direction over a substrate and a gate structure extending in a second direction overlying the fin. The gate structure includes a gate dielectric layer overlying the fin, a gate electrode overlying the gate dielectric layer, and a first insulating gate sidewall on a first lateral surface of the gate electrode extending along the second direction. A source/drain region is formed in the fin in a region adjacent the gate structure. A portion of the source/drain region extends under the insulating gate sidewall for a substantially constant distance along the first direction.

In another embodiment of the present disclosure, a method for manufacturing a semiconductor device is provided. The method includes forming a fin extending in a first direction over a substrate, and forming a plurality of gate structures extending in a second direction overlying the fin. The gate structures include a gate dielectric layer overlying the fin, gate electrodes overlying the gate dielectric layer, and insulating gate sidewalls on opposing lateral surfaces of the gate electrodes extending along the second direction. A portion of the fin in a first region between adjacent gate structures is removed to form a recess in the fin. A doped region is formed in a surface of the recess. The doped region is removed to form an enlarged recess, and a source/drain region is formed in a surface of the enlarged recess. The source/drain region extends under insulating gate sidewalls of adjacent gate structures along the second direction.

In another embodiment of the present disclosure, a method for manufacturing a semiconductor device is provided. The method includes forming one or more fins extending in a first direction over a substrate. The one or more fins include at least one second region along the first direction and first regions on either side of each second region along the first direction. A gate structure extends along a second direction overlying the second region of the fins. The gate structure includes a gate dielectric layer overlying the fin, a gate electrode overlying the gate dielectric layer, and a pair of insulating gate sidewalls formed on opposing lateral surfaces of the gate electrode extending along the second direction. A portion of the fins is removed in the first regions to form recesses in the first regions. Doped regions are formed in a surface of the recesses. The doped regions are removed to form enlarged recesses, and source/drain regions are formed in a surface of the enlarged recesses. The source/drain regions extend under adjacent insulating gate sidewalls along the second direction.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing a semiconductor device, comprising:
   forming a fin extending in a first direction over a substrate;
   forming a plurality of gate structures extending in a second direction overlying the fin, wherein the gate structures comprise:
      a gate dielectric layer overlying the fin;
      gate electrodes overlying the gate dielectric layer; and
      insulating gate sidewalls on opposing lateral surfaces of the gate electrodes extending along the second direction;
   removing a portion of the fin in a first region between adjacent gate structures to form a recess in the fin;
   forming a conformally doped region in a surface of the recess;
   removing the conformally doped region to form an enlarged recess; and
   forming a source/drain region in a surface of the enlarged recess, wherein the source/drain region extends under insulating gate sidewalls of adjacent gate structures along the second direction.

2. The method for manufacturing a semiconductor device according to claim 1, wherein the conformally doped region is formed by implanting a dopant into the surface of the recess.

3. The method for manufacturing a semiconductor device according to claim 1, wherein the conformally doped region is formed by plasma doping.

4. The method for manufacturing a semiconductor device according to claim 1, wherein the conformally doped region has a thickness of about 0.5 nm to about 10 nm.

5. The method for manufacturing a semiconductor device according to claim 1, wherein the forming source/drain regions comprises depositing an epitaxial material in the enlarged recess.

6. A method for manufacturing a semiconductor device, comprising:
   forming one or more fins extending in a first direction over a substrate,
   wherein the one or more fins include at least one second region along the first direction and first regions on either side of each second region along the first direction;
   forming a gate structure extending along a second direction overlying the second region of the fins, wherein the gate structure comprises:
      a gate dielectric layer overlying the fin;
      a gate electrode overlying the gate dielectric layer; and
      a pair of insulating gate sidewalls formed on opposing lateral surfaces of the gate electrode extending along the second direction; and
   removing a portion of the fins in the first regions to form recesses in the first regions;
   forming uniformly doped regions in a surface of the recesses, wherein the uniformly doped regions are continuous regions that follow contours of the recesses;
   removing the uniformly doped regions to form enlarged recesses; and
   forming source/drain regions in the enlarged recesses,
   wherein the source/drain regions extend under adjacent insulating gate sidewalls along the second direction.

7. The method for manufacturing a semiconductor device according to claim 6, wherein the uniformly doped regions are formed by implanting a dopant into the surface of the recesses.

8. The method for manufacturing a semiconductor device according to claim 6, wherein the uniformly doped regions are formed by conformal surface doping to form doped layers having substantially uniform thicknesses in the surface of the recesses.

9. The method for manufacturing a semiconductor device according to claim 8, wherein the uniformly doped regions are formed by plasma doping.

10. The method for manufacturing a semiconductor device according to claim 8, wherein the doped layers have a thickness of about 0.5 nm to about 10 nm.

11. The method for manufacturing a semiconductor device according to claim 6, wherein a plurality of the second regions are formed on each fin, and the second regions and the first regions are alternatingly formed along the first direction.

12. The method for manufacturing a semiconductor device according to claim 11, wherein a gate structure is formed over each second region.

13. The method for manufacturing a semiconductor device according to claim 6, wherein the forming source/drain regions comprises depositing an epitaxial material in the enlarged recesses.

14. A method for manufacturing a semiconductor device, comprising:
   forming an insulating layer over a plurality of spaced-apart gate structures overlying a fin, wherein the fin extends in a first direction,
   and the gate structures extend in a second direction substantially perpendicular to the first direction;
   etching a portion of the insulating layer between two adjacent gate structures to expose a first portion of the fin;
   etching the first portion of the fin to form a recess in the fin;
   conformally doping the surface of the recess to form a doped region;

selectively etching the doped region to remove the doped region, thereby forming an enlarged recess extending into a portion of the fin underlying the gate structures; and forming a source/drain region in a surface of the enlarged recess where the doped region was removed.

15. The method for manufacturing a semiconductor device according to claim 14, wherein the doped region has a substantially uniform thickness in the surface of the recess.

16. The method for manufacturing a semiconductor device according to claim 14, wherein the doped region is formed by plasma doping.

17. The method for manufacturing a semiconductor device according to claim 14, wherein the forming the source/drain region comprises depositing an epitaxial material in the enlarged recess.

18. The method for manufacturing a semiconductor device according to claim 14, wherein the portion of the insulating layer is anisotropically etched.

19. The method for manufacturing a semiconductor device according to claim 14, wherein the doped region is isotropically etched.

* * * * *